(12) United States Patent
Schramm

(10) Patent No.: US 6,866,752 B2
(45) Date of Patent: Mar. 15, 2005

(54) METHOD OF FORMING ULTRA THIN FILM DEVICES BY VACUUM ARC VAPOR DEPOSITION

(75) Inventor: Harry F. Schramm, Winchester, TN (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 181 days.

(21) Appl. No.: 09/962,704

(22) Filed: Aug. 23, 2001

(65) Prior Publication Data

US 2003/0038026 A1 Feb. 27, 2003

(51) Int. Cl.[7] .............................................. C23C 14/34
(52) U.S. Cl. ............................ 204/192.38; 204/298.41
(58) Field of Search ...................... 204/192.38, 298.41, 204/298.25, 298.26; 427/540, 580

(56) References Cited

U.S. PATENT DOCUMENTS

| | | | |
|---|---|---|---|
| 4,505,948 A | * 3/1985 | Pinkhasov | ................. 427/580 |
| 4,891,254 A | 1/1990 | Bianco | |
| 5,118,369 A | 6/1992 | Shamir | |
| 5,356,511 A | 10/1994 | Hoessel et al. | |
| 5,380,415 A | 1/1995 | Poorman et al. | |
| 5,580,429 A | * 12/1996 | Chan et al. | ............. 204/192.38 |
| 5,858,471 A | * 1/1999 | Ray et al. | .................... 427/524 |
| 5,898,370 A | 4/1999 | Reymond | |
| 5,955,949 A | 9/1999 | Cocita | |
| 5,982,284 A | 11/1999 | Baldwin et al. | |
| 6,031,458 A | 2/2000 | Jacobsen et al. | |
| 6,091,332 A | 7/2000 | Eberhardt et al. | |
| 6,091,333 A | 7/2000 | Oshima | |
| 6,094,138 A | 7/2000 | Eberhardt et al. | |
| 6,104,278 A | 8/2000 | Altwasser | |
| 6,104,311 A | 8/2000 | Lastinger | |
| 6,118,377 A | 9/2000 | Bonkowski et al. | |

FOREIGN PATENT DOCUMENTS

| | | | | |
|---|---|---|---|---|
| DE | 3924716 A | * | 2/1990 | ........... C23C/14/14 |
| JP | 63000458 A | * | 1/1988 | ........... C23C/14/24 |

* cited by examiner

Primary Examiner—Gregg Cantelmo
(74) Attorney, Agent, or Firm—James J. McGroary; Ross F. Hunt, Jr.

(57) ABSTRACT

A method for providing an ultra thin electrical circuit integral with a portion of a surface of an object, including using a focal Vacuum Arc Vapor Deposition device having a chamber, a nozzle and a nozzle seal, depressing the nozzle seal against the portion of the object surface to create an airtight compartment in the chamber and depositing one or more ultra thin film layer(s) only on the portion of the surface of the object, the layers being of distinct patterns such that they form the circuit.

12 Claims, 2 Drawing Sheets

METHOD OF FORMING ULTRA THIN FILM DEVICES BY VACUUM ARC VAPOR DEPOSITION

ORIGIN OF THE INVENTION

The invention was made by an employee of the United States Government and may be manufactured and used by or for the Government for governmental purposes without the payment of any royalties.

BACKGROUND OF THE INVENTION

1. Field of the Invention

This invention relates to the Vacuum Arc Vapor Deposition of metallic and non-metallic thin films that bond permanently at the atomic level to the surface of a substrate and, in particular, to the deposition of multiple layers of materials to form a type of solid state circuit or microchip, e.g., an individual custom responsive circuit (sensor or transponder), integrated circuit or memory device.

2. Description of the Related Art

Microchips and responsive circuits, such as RFID tags, are routinely used for identification of objects and processing and storage of information related to such objects or their use. In most cases, the microchip is either bonded to a substrate with adhesive or it is embedded within a tag, e.g., between the layers of a plastic card. Sometimes, it is encased in a plastic cover to protect it.

Microchips for storage and transfer of information are available in many types. The passive types usually respond to proximity sensing or even touch and the active types typically are externally powered, such as with a battery. The active types typically transmit their response a greater distance and provide a much more flexible identification system, but, with such types, the size of the batteries prevent miniaturization of the entire circuit.

One limiting factor common to all microchips and tags is the attachment of the microchip or tag to the identified object. Microchips and tags that are bonded to objects with adhesives protrude from the surface of the objects and can either fall off or become damaged. They do not work well on moving parts or within an assembly as they can fall off and damage valuable equipment. Thus, their applications are limited since they are not integral with the substrate.

While microchips appear small and thin to the human eye, even the thinnest of these chips (100 microns or 4 thousandths of an inch) is too thick for many applications. In laminated devices (cards), the edge of the embedded microchip results in a raised portion on the outer surface of the card that both gives away the presence of the microchip and makes undesirable wrinkles in the printing area. However, having a microchip embedded or attached to the surface of a part appears to be the only way to store as much onboard information about the part as is required in some cases. Thus, the microchip industry is searching for ways to produce much thinner chips and more durable ways to attach them.

One method that has been tried is to print layers directly on the object, primarily using conductive inks, to form the circuit. While this printing method works fairly well to form certain conductive layers, as may be used in a passive RFID circuit, for example, one significant drawback is that this method is not capable of providing layers of many of the materials that are desirable in producing more complex layered circuits or microchips. The printing process relies on the ability of the substrate (usually paper) to be nonconductive and absorb the ink medium that carries some conductive material. This precludes use on a conductive surface. It also precludes layering circuits without additional layers of paper for the insulator. The present invention also provides for incorporating the dielectrics, a capability missing in paper labels. Further, printed layers are not formed as part of the object and, therefore, they may wear or wash off over time or with abuse, thereby destroying the functional characteristics of the circuits. Additionally, printed layers may outgas in a vacuum or evaporate under high temperatures. The present invention is durable and reliable under these conditions as it relies on materials joined at the atomic level.

In the context of simple marking of parts for identification by humans or machines, the aerospace industry has been seeking new marking methods that are safe and that can withstand harsh environments. The National Aeronautics and Space Administration (NASA) investigated a number of methods to spray and bond particles consisting of atoms and ions of source material onto surfaces. These included plasma-activated chemical vapor deposition, laser chemical deposition, sputtering, cathode-spot arc coating, electron beam evaporation deposition, ion plating, arc evaporation and cathode arc plasma deposition. However, all of the known processes tend to have relatively slow deposition rates compared to non-vapor coating methods. Consequently, NASA developed a Vacuum Arc Vapor Deposition (VAVD) apparatus, as described in U.S. Pat. No. 5,380,415 (which is herein incorporated by reference), consisting of a vacuum chamber system for producing vapor deposits. It utilizes the arc formed in a gas flowing through a hollow tungsten electrode in a substantially vacuum environment. The VAVD process is capable of very low or very high deposition rates and produces no hazardous wastes or by-products.

Tests conducted using the VAVD apparatus produced high quality thin film coatings including small, high fidelity human and machine-readable part identification symbols in seconds. The apparatus was also capable of producing single and multiple layer circuits. However, this apparatus was impractical for many uses because the size and operation of the vacuum chamber limited both the size and volume of parts being marked and, of course, it required operation within a vacuum chamber which adds significant complication to any manufacturing process.

In October of 2000, U.S. pat. app. Ser. No. 09/703,029 was filed by the National Aeronautics and Space Administration and has now issued as U.S. Pat. No. 6,395,151 B1 (the '151 patent). The '029 application (which is herein incorporated by reference) was filed on an improved VAVD device capable of depositing thin film layers directly on and integral with only a portion of a substrate, in essence, a focal VAVD device. For flexibility and field applications, the apparatus may be hand held and brought to any object or substrate needing its service. For stability and repeatability, the apparatus may be mounted to a robot or at a fixed station. In general terms, the device comprises a housing forming a chamber. Enclosed within the chamber are an electrode and a charge and the chamber includes a vacuum port and a deformable nozzle. A mask is placed between the nozzle and a substrate that is to receive the deposition, the mask including a pattern therethrough that is representative of the desired shape of the deposited material. With the nozzle sealed against the mask, a vacuum is drawn in the chamber. Next, the charge is at least partially vaporized by the electrode allowing the vapor to deposit on the portion of the substrate exposed through the mask.

Some of the materials that can be deposited using the VAVD process include pure metals such as aluminum, chromium, gold, molybdenum, nickel, silver, stainless steel, titanium and tungsten. Commonly used alloys include stainless steel, nickel-chromium, lead, tin and M—Cr—Al—Y. Typical compounds used in the process include Al2O3, TiC and TiB2. Silicon and many silicon compounds can also be deposited.

The invention of the '029 application overcomes many of the drawbacks and disadvantages of known marking methods and other thin film deposition devices. One capability of the disclosed device is to provide a means to clean and prepare a surface prior to applying a thin film deposition. The cleaning device preferably utilizes a high frequency generator and a cathode ring in close proximity to the part surface. This cleaning method removes contaminants and oxides from the area that will contain the deposited film layer.

SUMMARY OF THE INVENTION

The present invention comprises a method for providing an individual custom responsive circuit (sensor or transponder), integrated circuit or memory device directly onto the surface of an object by building the circuit out of thin film layers of material that are applied onto a portion of the surface of the object. In a preferred embodiment, the layers are deposited onto the surface using a Vacuum Arc Vapor Deposition (VAVD) device that focuses on only a portion of the object or substrate.

The invention utilizes a VAVD device and method substantially similar to that disclosed in the '151 patent. However, while in the '151 patent the device is used to deposit single layers of material onto the substrate to be used as identification symbols, in the present invention, the same device is used to deposit multiple layers of materials onto the substrate to create the desired electrical circuits. Consequently, in the present invention, the VAVD device can be hand held or mounted on or controlled by a manufacturing machine, for example, a robot arm. Obviously, the degree of registration required between the multiple layers will dictate the mounting mechanism for the device.

When appropriate, a thin film of material that is either conductive or nonconductive is first deposited on the substrate. Then the features of the circuit are created through the use of a series of masks and index marks and further layers of deposition on the substrate. Thus, when completed, the circuit (e.g., a microchip) actually joins the substrate at the atomic level, making it virtually a permanent part of the substrate. Being ultra thin, the chip does not protrude significantly from the object surface, thus minimizing the potential for damage, and the chip can be painted over and is virtually non detectable. The deposited layers can be as thin as 5 Angstroms or 0.5 nanometers making the minimum two layer RFID circuit or microchip produced using this method about 10 Angstroms thick.

This method has significant advantages over current methods for producing microchips. Current production methods for microchips, for example begin with a block of silicon and take away material via an etching process and then backfill using conductive material to make the circuit. In the present invention, the microchip is built-up from the substrate in layers by adding the necessary layers through vapor deposition.

In this invention, thin film deposition is used for a wide variety of base materials and alloys. Thus, the invention makes possible the use of materials that cannot currently be used in other layering methods due to processing difficulties. Some of the materials deposited using the VAVD process include pure metals such as aluminum, chromium, gold, copper, molybdenum, nickel, silver, titanium and tungsten. Commonly used alloys include stainless steel, nickel-chromium, lead, tin and M—Cr—Al—Y. Typical compounds used in the process include Al2O3, TiC and TiB2. Commonly used dielectrics such as silicon and silicon compounds can be vapor deposited without inducing detrimental heat effects on the substrate as VAVD is a thin film process that can be used to deposit silicon and other materials at low temperatures. The targeted substrate does not experience temperatures exceeding 150 degrees F. Further, the particle velocity is in a range that easily allows the deposition of metallic materials on paper substrates.

In a preferred embodiment of the present invention, the VAVD is conducted with the use of the device shown in FIG. 1, the operational elements of which are disclosed in FIG. 2 of the '151 patent. The focal VAVD device is positioned either at a fixed station or with a robot mechanism so that registration between the VAVD device and the substrate is maintained as successive layers are deposited. In an alternative embodiment, with the use of optically controlled robots or the like, an assembly line of sorts may be utilized with a number of focal VAVD devices, each depositing a particular material, arranged to deposit successive layers on a substrate. In yet another alternative embodiment, the VAVD device may be a hand held apparatus that can be brought to any substrate and a single layer circuit applied. In either case, the focal nature of the device means that the object does not have to enter a vacuum chamber. Instead, a vacuum chamber for the deposition is created within the chamber of the VAVD device when the device is sealed on a portion of the object.

There are several unique features of this invention. First, ultra thin layers of conductive, non conductive and dielectric materials can be vacuum vapor deposited using focal VAVD without the object that is undergoing the process entering a vacuum chamber. Second, the VAVD deposited layers can be as thin as 5 Angstroms or 0.5 nanometers which is orders of magnitude thinner than the layers resulting from other methods.

Further, an individual custom responsive circuit (sensor or transponder), integrated circuit, memory or microchip can be vapor deposited and grown with whatever features are necessary to complete its function. Such devices are produced by using completely additive methods that build all the features of the device from the substrate up. Accordingly, it is no longer cost prohibitive to produce small quantities of a particular circuit and, if appropriate, each chip can be specially tailored for a particular object and there is no cost or errors associated with matching the object with its chip, as there is when custom stand alone chips are made for a set of differing objects. Also, the circuit or chip becomes a permanent part of the substrate, thus eliminating problems associated with bonding or tolerances.

Further, the present method enables virtual onboard computers and sensors for any part or assembly in any location or situation. Onboard histories for certain products will realistically be available. The cost to vapor deposit a memory chip as an integral part of the substrate is orders of magnitude less than the cost of making and attaching a separate memory chip. Moreover, the circuit or chip can be deposited in situ for many large existing applications and can be brought easily into an existing production line without the complication of a vacuum chamber.

Commercial applications for the present invention include radio frequency tags, smart cards, cell phones, and other digital devices. They all use microchips of various types, usually flash memory, EPROMS, etc. With respect to the government, the military would be a primary user with its need for security and information integrity. It would be advantageous for the military to attach the history of a part on its surface since links to main frame databases do not exist in battlefield conditions. Also, high order law enforcement would be a primary user of this technology. There is potential for use in currency (both paper and coin).

Another area for application is in anti counterfeiting. The present invention could be put on a product and programmed in a read only format and hidden from view. This integral memory device would be expensive to duplicate and would discourage most counterfeiters. From airplane parts to upscale clothing to sporting event tickets, anti counterfeiting applications are numerous.

Accordingly, the focal VAVD device overcomes many of the drawbacks and disadvantages of other thin film deposition apparatus and provides a means to produce an individual custom responsive circuit (sensor or transponder), integrated circuit, memory device or microchip permanently on a part without adhesives, adhesive layers, inks or printing techniques. It is described as ultra thin since the VAVD process typically applies layers of materials at a thickness of about 5 Angstroms or 0.5 nanometers. Although the VAVD process is fully capable of depositing at rates that are orders of magnitude higher if necessary, in a preferred embodiment, one object of this invention is to provide a single layer or multiple layer individual custom transponder, circuit, memory device or microchip that is on the order of 0.5 nanometers thickness per layer. Further, the present invention provides a method for applying thin film circuits or chips on substantially flexible substrates.

One object of the present invention is to provide a method for applying a VAVD thin film deposition antennae for a custom responsive circuit (sensor or transponder), to a surface using a mask to form a representation of the antennae configuration.

Another object of the present invention is to provide a method to vapor deposit distinct component parts for RFID tags such as resistors, capacitors and inductors usually disposed on the tag by standard manufacturing techniques.

It is a further object of the present invention to provide a method for applying a thin film dual layer mark to a surface where the top layer is a conductive material, the area of which is limited to the size of the desired custom responsive circuit (sensor or transponder), and that portions of the top layer are subsequently selectively removed using a separate device, such as a laser, to form a representation of a circuit or memory configuration.

It is yet another object of present invention to provide a method for applying a thin film coating to a surface, the area of which is limited to the size of the desired mark, with a material and a configuration that exhibits a response to certain radio emissions to promote the capture and recognition of a part identification.

Another object of the present invention is to provide a method for using alternate materials that can not be used with current manufacturing methods to meet conductive, nonconductive and dielectric requirements. This could enable the use of materials that would permanently hold a charge instead of one that loses a charge.

Another object of the present invention is to provide an ultra thin VAVD applied custom responsive circuit (sensor or transponder), covered with a coating which is limited to a desired size, for aesthetic or security reasons.

Another object of the present invention is to provide a method to minimize counterfeiting or theft by vapor depositing a distinctive feature for authenticating the article without the feature being readily apparent to a counterfeiter or thief.

Another object of the present invention is to provide a method of producing an individual custom responsive circuit (sensor or transponder), integrated circuit, memory device or microchip of consistent quality, eliminating marginal devices, yield loss, ragged edges and other defects associated with current manufacturing processes.

It is still another object of the present invention to provide a method of producing a thin film of clear metal that is deposited over an ultra thin VAVD applied custom responsive circuit (sensor or transponder), the area of which is limited to a desired size, to provide protection from adverse environmental conditions.

The particular features and advantages of the present invention as well as other objects will become apparent from the following description taken in conjunction with the accompanying drawings.

DETAILED DESCRIPTION OF THE PREFERRED EMBODIMENTS

The Vacuum Arc Vapor Deposition marking method can be used to apply graphical representations, human-readable characters, and a wide range of different machine-readable identification symbols to both metallic and non-metallic surfaces. The preferred representations for the present invention are patterns that form individual custom responsive circuit (sensor or transponder), integrated circuit, memory device or microchip configurations.

Figure 1:
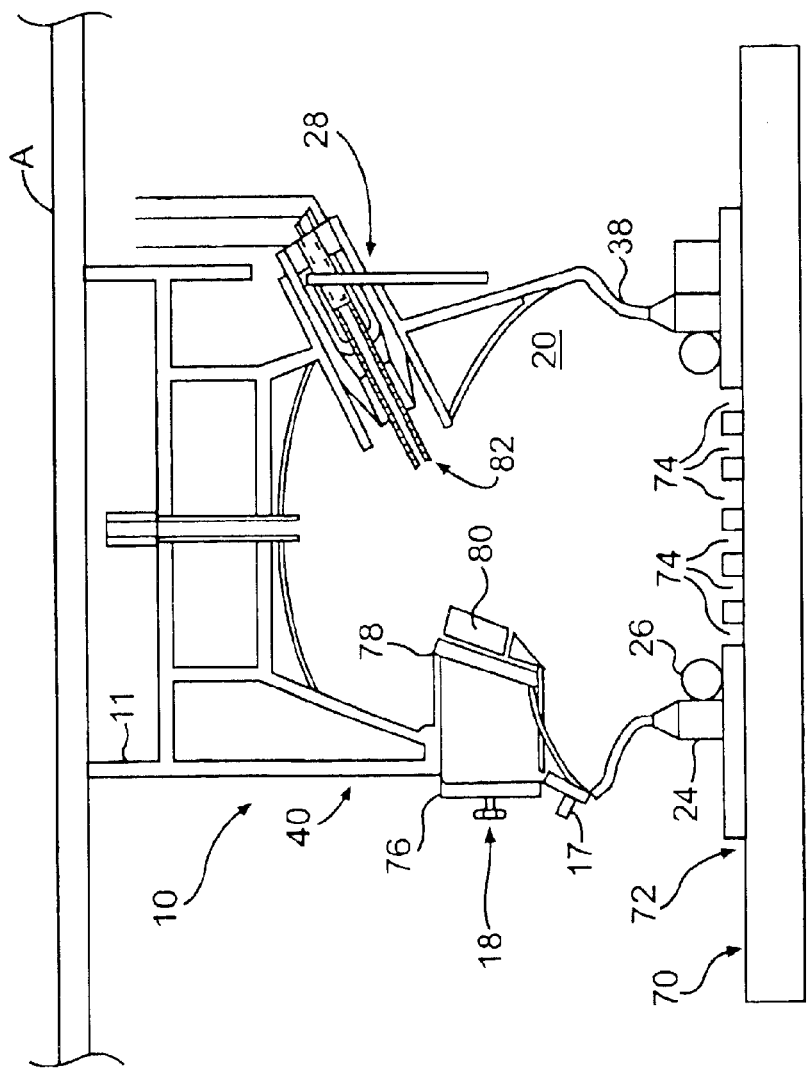
FIG. 1 is a cross section view of a focal VAVD device as disclosed in the above-mentioned '151 patent.

FIG. 1 is a cross sectional view of the VAVD device disclosed in the '029 application with the basic elements labeled. The focal VAVD device 10 is positioned over a substrate 70, with a mask 72 positioned between the VAVD device 10 and the substrate 70. The VAVD device 10 comprises a housing 40 that forms a chamber 20 in which a vacuum is drawn. Device 10 also includes a support frame 11, a seal 24 and a cleaning device 26. As an alternative to being hand held, in FIG. 1, VAVD device 10 is fixed to an arm A, which can be an arm of a robot or any other manufacturing machine that holds and guides the VAVD device in operation. An anode assembly 18 provides a charge 80 which is held by a holder 78 within chamber 20 and a cathode assembly 28 provides and electrode 82 within the chamber. The nozzle 38 of housing 40 is, advantageously, deformable and flexes as the nozzle is pushed into contact with mask 72 in operation. Preferably, vacuum port 17 from chamber 20 is connected to a vacuum pump (not shown) which, during a cleaning operation, draws impurities from the surface along with a substantial portion of ambient air, leaving a clear path of flow for the thin film vapor generated in the chamber. The pattern of openings 74 in mask 72 forms a representation of one layer of a desired circuit.

For each custom circuit, a plurality of masks are prepared and the masks are used with the focal VAVD device to create successive layers of the circuit. Typically, the circuit is created by depositing one layer on top of another, with the shape of each layer being determined by the pattern of the mask. In a preferred embodiment, a selected material is deposited through each mask and the materials and mask patterns are chosen to provide layers that operate together to provide the desired circuit.

Figure 2:
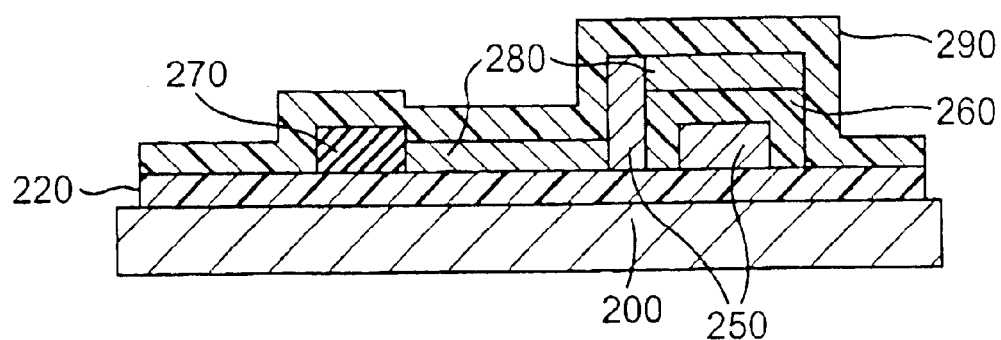
FIG. 2 illustrates a cross section view of one embodiment of an ultra thin film circuit configuration on a conductive substrate (not to scale) with various features derived from the VAVD method of the present invention wherein positive masks are used to form the circuit and negative masks are used to backfill around the circuit.
Figure 3:
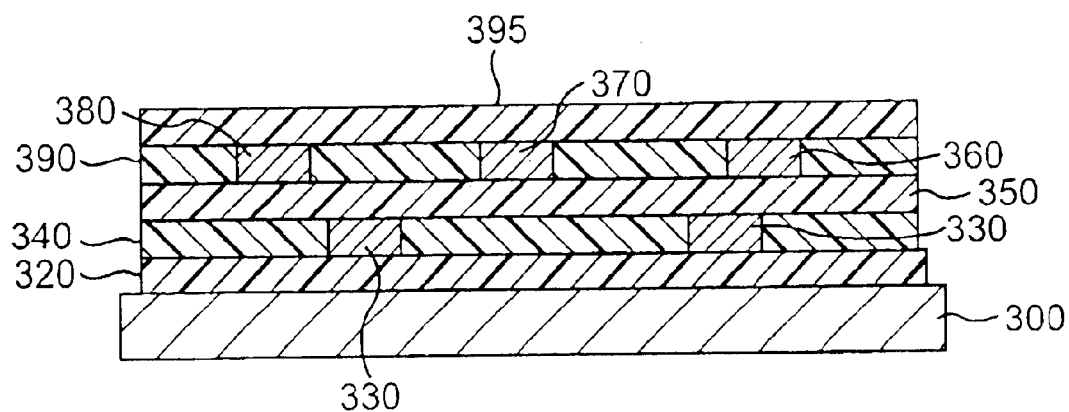
FIG. 3 illustrates a cross section view of a second embodiment of an ultra thin film circuit configuration on a conductive substrate (not to scale) with various features derived from the use of positive masks for forming the circuit and negative masks to backfill around the circuit.
Figure 4:
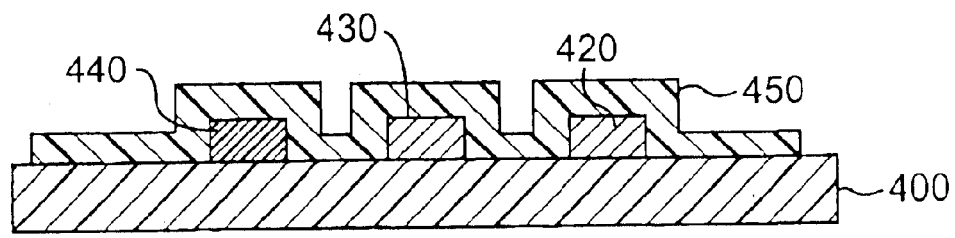
FIG. 4 illustrates a cross section view of a third embodiment of an ultra thin film circuit configuration on a nonconductive substrate (not to scale) with various features derived from the VAVD process of the present invention wherein positive masks are used to form the circuit.

FIGS. 2–4 show cross sectional views of the layers of certain ultra thin film circuits of the type created by the method of the invention. In order to make the various ultra thin film layers discernable, the drawings are not to scale so that the thickness of the layers has been magnified greatly with respect to their width. As noted above, the present invention is capable of depositing layers on the order of 5 Angstroms thick.

FIG. 2 shows a cross sectional view of one embodiment of an ultra thin film circuit configuration deposited on a conductive substrate. In the method of the present invention, vacuum compatible substrate 200 is cleaned and prepared for the vapor deposition process by the focal VAVD device. Substrate 200 is conductive, so a nonconductive layer 220 is preferred to insulate the circuit from the substrate. The VAVD process is used to apply the first layer 220 in the thickness desired. Advantageously, first layer 220 is deposited through a mask with no internal pattern but having an opening sufficient to define the border of the circuit. Alternatively, first layer 220 may be deposited without the use of a mask or the border mask may be a built-in part of the focal VAVD device. The second layer is vapor deposited through a mask to form feature 250. Feature 250 is conductive and represents a circuit element. The third layer is vapor deposited through a mask to form feature 260 as a nonconductive element or insulator, and covers only the circuit element in feature 250. The fourth layer is vapor deposited through a mask and forms dielectric feature 270. The fifth layer is vapor deposited through a mask to form feature 280 which is a conductive layer and represents a circuit element that is laid across circuit element 250. Features 250 and 280 do not touch due to insulating feature 260, therefore not completing a circuit. Feature 280 is in contact with dielectric feature 270 to complete a circuit and to take advantage of its properties. An optional feature 290 is vapor deposited over the entire device as a nonconductive protective coating.

FIG. 3 is a cross section view of a representative circuit configuration (not to scale) and is illustrated with various features deposited through masks in the VAVD process with layer thickness of 0.5 nanometers or higher if required. Vacuum compatible substrate 300 is cleaned and prepared for the vapor deposition process by the focal VAVD device. Substrate 300 is conductive, so a nonconductive layer 320 is preferred to insulate the circuit from the substrate. The VAVD process is used to apply the first layer 320 in the thickness desired. The second layer is vapor deposited through a mask to form multiple feature 330. Feature 330 is conductive and represents two circuit elements. The third layer is vapor deposited through a mask to form feature 340 as a nonconductive element or insulator, and covers feature 320 up to and even with the top of feature 330. This method is necessary when conductive or dielectric features are required to be dimensionally at the same height as nonconductive features in the same layer. The fourth layer is vapor deposited through a mask and forms feature 350, a nonconductive layer to isolate the operation of layered circuits. The fifth layer is vapor deposited through a mask, resulting in feature 360 which is conductive and represents another circuit element. The sixth layer is deposited through a mask to form a component such as a resistor, transistor or capacitor 370. The seventh layer is vapor deposited through a mask to produce dielectric feature 380. The eighth layer is vapor deposited through a mask to form feature 390 as a nonconductive element or insulator, and covers feature 350 up to and even with the top of features 360, 370 and 380. An optional feature 395 is vapor deposited over the entire device as a nonconductive protective coating.

In FIG. 4 a cross section view of a representative circuit configuration (not to scale) is illustrated with various features occurring through masks from the VAVD process in its naturally conformal state and with layer thickness of 0.5 nanometers or higher if required. Vacuum compatible substrate 400 is cleaned and prepared for the vapor deposition process by the VAVD hand-held device. Substrate 400 is nonconductive. The first layer is vapor deposited through a mask to form feature 420. Feature 420 is conductive and represents a circuit element. The second layer is deposited through a mask to form a component such as a resistor, transistor or capacitor 430. The third layer is vapor deposited through a mask and forms dielectric feature 440. An optional feature 450 is vapor deposited over the entire device as a nonconductive protective coating.

The circuits shown in FIGS. 2–4 are meant to generally represent any number of specific circuit designs, i.e., circuit layouts, such as for individual custom responsive circuits (sensors or transponders), integrated circuits or memory devices. The prior art layout and design of specific circuits can typically be used in circuits made by the Vacuum Arc Vapor Deposition method of the present invention. The area of the "footprint" of the integral circuits made by the method of the present invention can vary considerably based on the electrical characteristics and requirements of the circuit, but is typically in the range of 1–6 square centimeters.

Although the present invention has been described with respect to the preferred embodiments herein, one of ordinary skill in the art will recognize that the invention is not limited to these embodiments and that changes and modifications may be made without departing from the broad aspects of the invention. The scope of this invention should not be limited except by the appended claims.

I claim:

1. A method for providing an ultra thin electrical circuit integral with a portion of a surface of an object comprising:

using a focal VAVD device comprising a chamber, a nozzle and a nozzle seal, depressing said nozzle seal against said portion of the surface to create an airtight compartment in said chamber; and depositing a non-conductive ultra thin film layer on said portion of said surface of said object; and depositing a conductive layer on top of said non-conductive ultra thin film layer said film layer being of a conductive material and forming a pattern associated with said circuit.

2. A method as in claim 1, wherein said conductive ultra thin film layer has an average thickness of approximately 5 Angstroms.

3. A method as in claim 1, further comprising depositing a non-conductive ultra thin film cover layer over said ultra thin film conductive layer.

4. A method as in claim 3, further comprising providing human-readable characters or machine-readable code on said non-conductive cover layer.

5. A method as in claim 4, wherein said machine-readable code is a bar code or 2-dimensional symbol.

6. A method as in claim 1, wherein said VAVD device further comprises a cleaning means, said method further comprising cleaning said portion of the surface using said cleaning means prior to depositing said conductive ultra thin film layer on said portion.

7. A method for providing an ultra thin electrical circuit integral with a portion of a surface of an object comprising:

using a focal VAVD device comprising a chamber, a nozzle and a nozzle seal, a first mask having a pattern of openings therein between said nozzle and said surface to confine the deposition of a conductive film layer onto said surface between said pattern of openings in said first mask and providing a second mask having a pattern of openings therein between said nozzle and said surface to confine the deposition of a non-conductive ultra thin film layer between and up to the level of the conductive film layer; and depressing said nozzle seal against said portion of the surface to create an airtight compartment in said chamber; and depositing said non-conductive ultra thin film layer on said portion of said surface of said object; and depositing said conductive layer on top of said non-conductive ultra thin film layer said film layer being of a conductive material and forming a pattern associated with said circuit.

8. A method for providing an ultra thin electrical circuit integral with a portion of a surface of an object comprising:

using a focal VAVD device comprising a chamber, a nozzle and a nozzle seal, depressing said nozzle seal against said portion of the surface to create an airtight compartment in said chamber; and depositing a non-conductive ultra thin film layer on said portion of said surface of said object; and depositing a conductive layer on top of said non-conductive ultra thin film layer said film layer being of a conductive material and forming a pattern associated with said circuit;

depositing additional ultra thin film layers on top of said conductive film layer to form said circuit.

9. A method for providing an ultra thin electrical circuit integral with a portion of a surface of an object comprising:

using a focal VAVD device comprising a chamber, a nozzle and a nozzle seal, depressing said nozzle seal against said portion of the surface to create an airtight compartment in said chamber; and depositing a non-conductive ultra thin film layer on said portion of said surface of said object; and depositing a conductive layer on top of said non-conductive ultra thin film layer said film layer being of a conductive material and forming a pattern associated with said circuit depositing additional ultra thin film layers on top of said conductive film layer to form said circuit; and maintaining positioning of said focal VAVD device with respect to said portion of said surface of said object as each additional layer is deposited.

10. A method for providing an ultra thin circuit integral with a portion of a surface of an object comprising:

positioning a focal VAVD device comprising a chamber, a nozzle and a nozzle seal, with respect to said portion of the surface of the object;

depressing said nozzle seal against said portion of the surface to create an airtight compartment in said chamber, operating said VAVD device to deposit a first ultra thin film layer only on said portion of said surface of said object, said film layer being of a conductive material and being deposited in a first pattern associated with a first layer of said circuit; and while maintaining the relative positions of said VAVD device and said portion of the surface of the object, depositing a second ultra thin film layer of a second material in a second pattern associated with a second layer of said circuit.

11. A method as in claim 10, wherein, if said portion of the surface of the object is conductive, using said VAVD device to deposit a non-conductive thin film layer onto said portion prior to depositing said first ultra thin film layer.

12. A method as in claim 10, wherein said first ultra thin film layer has an average thickness of approximately 5 Angstroms.

* * * * *